(12) United States Patent
Choo et al.

(10) Patent No.: US 9,054,061 B1
(45) Date of Patent: Jun. 9, 2015

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Kyo-Seop Choo, Suwon-si (KR); Jong-Uk Bae, Seoul (KR); Bo-Kyoung Cho, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/552,834

(22) Filed: Nov. 25, 2014

(30) Foreign Application Priority Data

Nov. 26, 2013 (KR) .......................... 10-2013-0144341
Nov. 20, 2014 (KR) .......................... 10-2014-0162848

(51) Int. Cl.
| | | |
|---|---|---|
| H01L 27/32 | (2006.01) | |
| H01L 51/56 | (2006.01) | |
| H01L 29/786 | (2006.01) | |
| H01L 27/12 | (2006.01) | |
| H01L 21/44 | (2006.01) | |
| H01L 49/02 | (2006.01) | |

(52) U.S. Cl.
CPC ........ *H01L 27/3276* (2013.01); *H01L 27/3258* (2013.01); *H01L 51/56* (2013.01); *H01L 29/7869* (2013.01); *H01L 27/1255* (2013.01); *H01L 21/44* (2013.01); *H01L 28/60* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2008/0115718 A1* | 5/2008 | Kim et al. ........................ | 117/43 |
| 2014/0145179 A1* | 5/2014 | Yoon et al. ...................... | 257/43 |

* cited by examiner

*Primary Examiner* — Charles Garber
*Assistant Examiner* — Alia Sabur
(74) *Attorney, Agent, or Firm* — McKenna Long & Aldridge LLP

(57) ABSTRACT

An OLED display device includes a first oxide semiconductor layer including first to fourth regions; a first gate electrode on a first insulating layer and the first oxide semiconductor layer, and completely overlapping the first region; a first storage electrode extending from the first gate electrode and overlapping the second region; a second insulating layer covering the first gate electrode and the first storage electrode and exposing the third and fourth regions; first source and drain electrodes on the second insulating layer and contacting the third and fourth regions; and an emitting diode connected to the first drain electrode, wherein a portion of the second region at an edge of the first storage electrode except a center of the first storage electrode is conductive to form a second storage electrode, and the first and second storage electrodes and the first insulating layer constitute a first storage capacitor.

10 Claims, 8 Drawing Sheets

ORGANIC LIGHT EMITTING DIODE DISPLAY DEVICE AND METHOD OF FABRICATING THE SAME

The present application claims the priority benefit of Korean Patent Application No. 10-2013-0144341 filed Nov. 26, 2013, and Korean Application No. 10-2014-0162848 filed Nov. 20, 2014, in Republic of Korea, which are herein incorporated by reference for all purposes as if fully set forth herein.

BACKGROUND OF THE INVENTION

1. Field of the Invention

The present invention relates to an organic light emitting diode (OLED) display device. More particularly, the present invention relates to an OLED display device having an improved storage capacitance, and a method of fabricating the same.

2. Discussion of the Related Art

As society has entered more of an information age, various types of display devices that represent all sorts of electrical signals as visual images have been rapidly developed. For example, a liquid crystal display (LCD) device and an organic light emitting diode (OLED) display device have been widely introduced and used as a substitute for a display device of cathode-ray tube type.

The OLED display device of new flat panel display devices is a self-emitting type. The OLED display device has excellent characteristics of a view angle, a contrast ratio and so on. Also, since the OLED display device does not require a backlight assembly, the OLED display device has low weight and low power consumption. Moreover, the OLED display device has advantages of a high response rate, a low production cost and so on. In addition, all elements of the OLED display device are a solid phase, the device is strong against an outer impact. Particularly, there is a big advantage in production cost. A fabricating process of the OLED display device is very simple and requires a deposition apparatus and an encapsulating apparatus.

In an active matrix type OLED device, a voltage for controlling an electric current of a pixel is charged in a storage capacitor such that a level of the electric current is maintained to a next frame.

FIG. 1 is a circuit diagram of one pixel region of the related art OLED display device.

As shown in FIG. 1, the OLED display device includes a gate line GL along a first direction, a data line DL along a second direction, a switching thin film transistor (TFT) Tsw, a storage capacitor Cst, a driving TFT Tdr, and an emitting diode E. The gate line GL and the data line DL cross each other to define a pixel region P.

The switching TFT Tsw is positioned at a crossing portion of the gate and data lines GL and DL and is connected to the gate and data line GL and DL. The driving TFT Tdr is electrically connected to the switching TFT Tsw.

The driving TFT Tdr and the storage capacitor Cst are connected to the switching TFT Tsw and a high level voltage VDD. The emitting diode E is connected to the driving TFT Tdr and a low level voltage VSS.

When the switching TFT Tsw is turned on by a gate signal applied through the gate line GL, a data signal from the data line DL is applied to the gate electrode of the driving TFT Tdr and an electrode of the storage capacitor Cst. When the driving TFT Tdr is turned on by the data signal, an electric current is supplied to the emitting diode E from the high level voltage VDD. As a result, the emitting diode E emits light. In this case, when the driving TFT Tdr is turned on, a level of an electric current to the emitting diode E is determined such that the emitting diode E can produce a gray scale.

The storage capacitor Cst serves to maintain the voltage of the gate electrode of the driving TFT Tdr when the switching TFT Tsw is turned off. Accordingly, even if the switching TFT Tsw is turned off, a level of an electric current to the emitting diode E is maintained to next frame.

To produce a high resolution display device, a number of pixel regions P in a unit area should be increased. Namely, in the high resolution display device, a size of one pixel region P is decreased.

When the size of one pixel region P is decreased, a size of the storage capacitor Cst is also decreased such that a storage capacitance is decreased.

When a size of the storage capacitor Cst is increased to provide high storage capacitance, the aperture ratio is reduced.

SUMMARY OF THE INVENTION

Accordingly, the present invention is directed to an OLED display device that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, an organic light emitting diode display device includes a first oxide semiconductor layer including first to fourth regions; a first insulating layer on the first oxide semiconductor layer; a first gate electrode on the first insulating layer and completely overlapping the first region; a first storage electrode extending from the first gate electrode and overlapping the second region; a second insulating layer covering the first gate electrode and the first storage electrode and exposing the third and fourth regions; first source and drain electrodes on the second insulating layer and contacting the third and fourth regions; and an emitting diode connected to the first drain electrode, wherein a portion of the second region at an edge of the first storage electrode except a center of the first storage electrode is conductive to form a second storage electrode, and the first and second storage electrodes and the first insulating layer constitute a first storage capacitor.

In another aspect, a method of fabricating an organic light emitting diode display device includes forming an oxide semiconductor layer on a substrate; forming a first insulating pattern and a gate electrode on a first region of the oxide semiconductor layer and a second insulating pattern and a first storage electrode on a second region of the oxide semiconductor layer; deoxidizing a portion of the second region inside an edge of the first storage electrode by performing a plasma process; forming an insulating layer exposing third and fourth regions of the oxide semiconductor layer at both sides of the first region and covering the gate electrode and the first storage electrode; forming source and drain electrodes on the insulating layer and contacting the third and fourth regions; and forming an emitting diode connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF ILLUSTRATED EMBODIMENTS

Reference will now be made in detail to the preferred embodiments of the present invention, examples of which are illustrated in the accompanying drawings.

Figure 1:
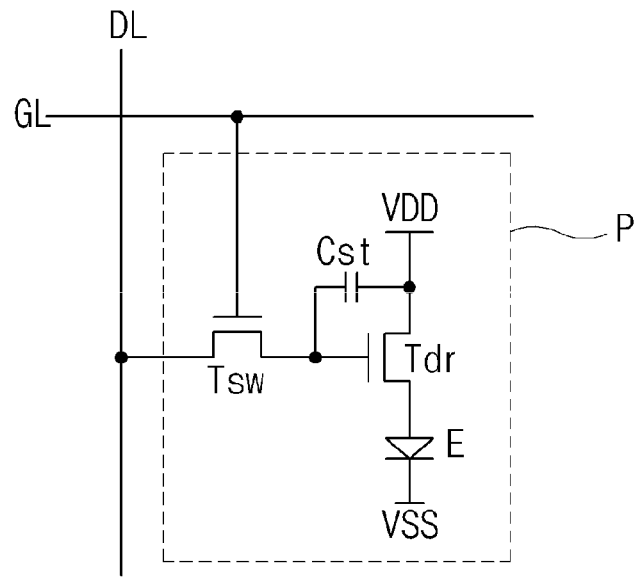
FIG. 1 is a circuit diagram of one pixel region of the related art OLED display device.
Figure 2:
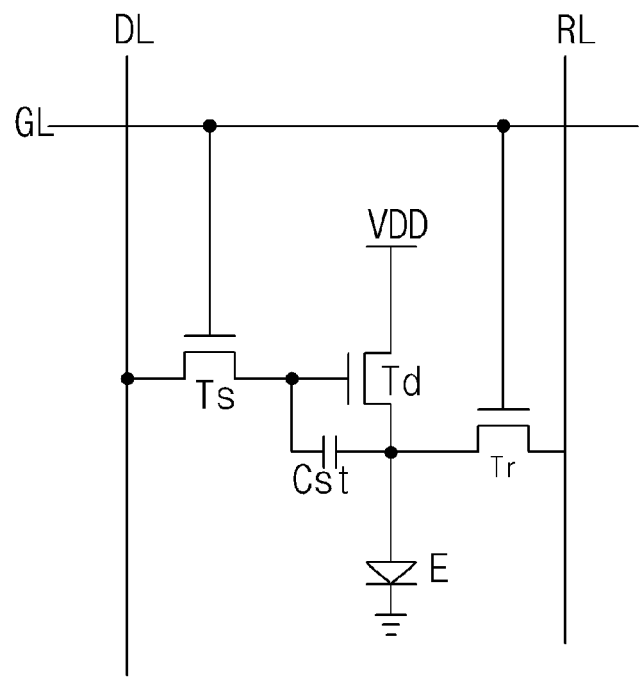
FIG. 2 is a circuit diagram of an OLED display device according to the present invention.

FIG. 2 is a circuit diagram of an OLED display device according to the present invention.

As shown in FIG. 2, an OLED display device according to the present invention includes a switching thin film transistor (TFT) Ts, a driving TFT Td, a reference TFT Tr, a storage capacitor Cst, and an emitting diode E in one pixel region.

In more detail, a gate line GL, which extends along a first direction, and a data line DL, which extends along a second direction, cross each other to define the pixel region. In addition, a power line VDD applying a high level voltage to the driving TFT Td and a reference line RL applying a reference voltage to the reference TFT Tr are formed.

The switching TFT Ts, the driving TFT Td, the reference TFT Tr, the storage capacitor Cst and the emitting diode E are formed in each pixel region.

A gate electrode and a source electrode of the switching TFT Ts are connected to the gate line GL and the data line DL, respectively, to receive a gate signal and a data signal. A gate electrode of the driving TFT Td is connected to a drain electrode of the switching TFT Ts.

A drain electrode of the driving TFT Td is connected to a drain electrode of the reference TFT Tr and a first electrode, i.e., anode, of the emitting diode E, and a source electrode of the driving TFT Td is connected to the power line VDD. A second electrode, i.e., cathode, of the emitting diode E is connected to a low level voltage.

A gate electrode of the reference TFT Tr is connected to the gate line GL, and a source electrode of the reference TFT Tr is connected to the reference line RL. A position of the source and drain electrodes of the references TFT "Tr" may be changed. Namely, the source electrode of the reference TFT Tr is connected to the drain electrode of the driving TFT Td, and a drain electrode of the reference TFT Tr is connected to the reference line RL. In addition, the gate electrode of the reference TFT Tr may be connected to another signal line, not the gate line GL.

Figure 3:
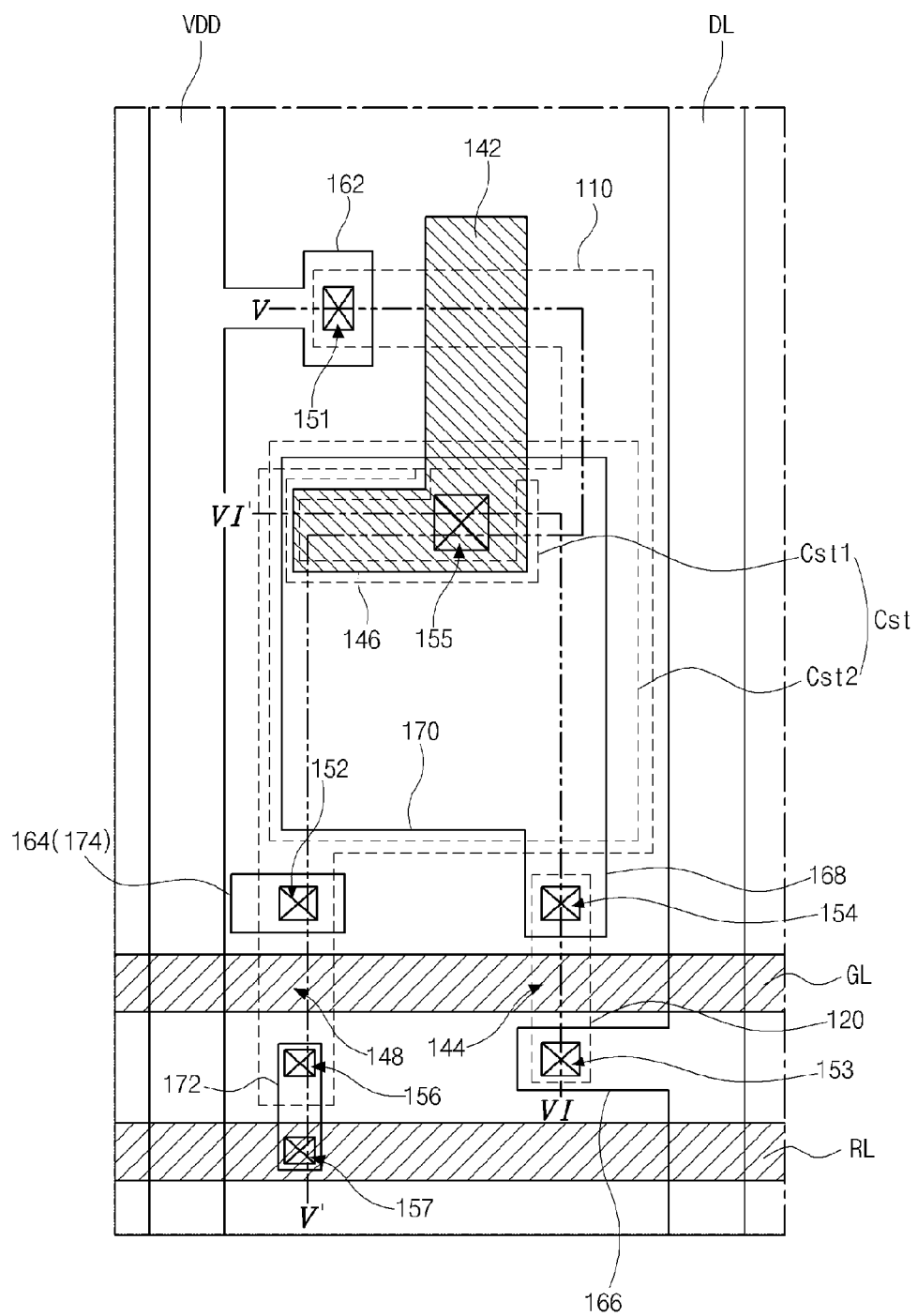
FIG. 3 is a plane view of a portion of an OLED display device according to a first embodiment of the present invention.

The storage capacitor Cst includes a first storage capacitor Cst1 (of FIG. 3) and a second storage capacitor Cst2 (of FIG. 3).

A first storage electrode of the first storage capacitor Cst1 is electrically connected to the drain electrode of the switching TFT Ts and the gate electrode of the driving TFT Td, and a second storage electrode of the first storage capacitor Cst1 is electrically connected to the drain electrode of the driving TFT Td.

In addition, a first storage electrode of the second storage capacitor Cst2 is electrically connected to the drain electrode of the driving TFT Td, and a second storage electrode of the second storage capacitor Cst2 is electrically connected to the drain electrode of the switching TFT Ts and the gate electrode of the driving TFT Td.

The switching TFT Ts is switched by a gate signal to provide a data signal into the gate electrode of the driving TFT Td, and the driving TFT Td is switched by the data signal to control the electric current into the emitting diode E. A voltage for controlling an electric current of the emitting diode E is charged in a storage capacitor Cst such that a level of the electric current is maintained to next frame.

When the switching TFT Ts is turned on by the gate signal applied through the gate line GL, the data signal from the data line DL is applied to the gate electrode of the driving TFT Td such that the driving TFT Td is turned on. When the driving TFT Td is turned on by the data signal, the electric current is supplied to the emitting diode E from the power line VDD. As a result, the emitting diode E emits light. In this case, when the driving TFT Td is turned on, a level of an electric current to the emitting diode E is determined such that the emitting diode E can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current to the emitting diode E is maintained to a next frame.

When the reference TFT Tr is turned on, the drain electrode of the reference TFT Tr is connected to the drain electrode of the driving TFT Td such that property deviation of the driving TFT Td is reduced. Namely, since the property deviation of the driving TFT Td is minimized with three TFTs in one pixel region, the aperture ratio of the OLED display device is improved. On the other hand, the reference TFT Tr can be omitted.

In the present invention, a storage capacitance of the storage capacitor Cst is improved or maximized without decreasing the aperture ratio. As a result, the high resolution OLED display device with the improved aperture ratio is provided. In addition, since the deviation of the driving TFT Td is reduced, the brightness difference in the OLED display device is prevented.

Figure 4A:
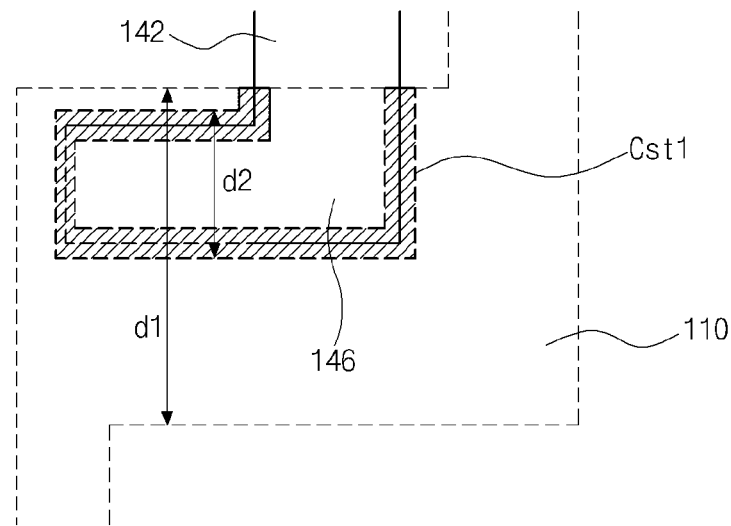
FIGS. 4A and 4B are a plane view and a cross-sectional view of a first storage capacitor in FIG. 3, respectively.
Figure 4B:
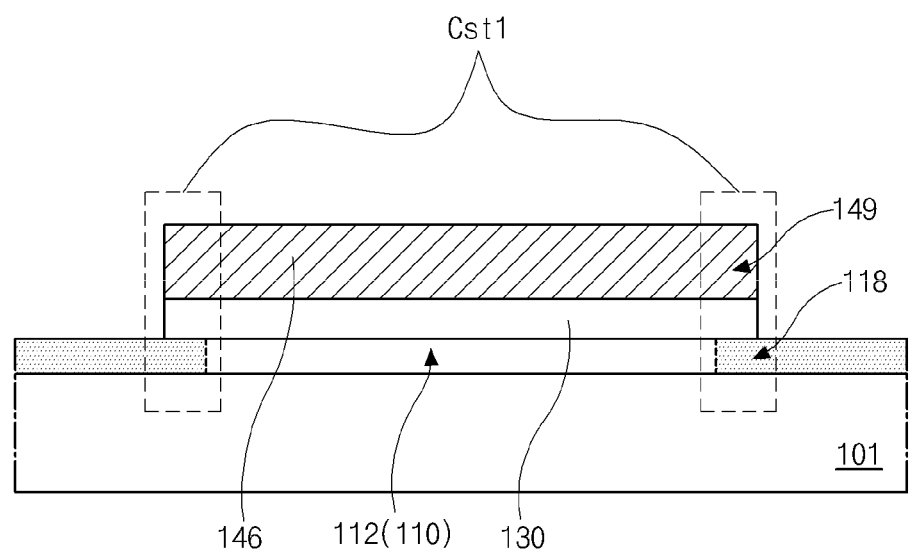

FIG. 3 is a plane view of a portion of an OLED display device according to a first embodiment of the present invention, and FIGS. 4A and 4B are a plane view and a cross-sectional view of a first storage capacitor in FIG. 3, respectively.

As shown in FIG. 3, in the OLED display device according to the first embodiment of the present invention, the gate line GL and the data line DL cross each other to define the pixel region. In addition, the power line VDD is spaced apart from and is parallel to the data line DL to cross the gate line GL, and the reference line RL is spaced apart from and is parallel to the gate line GL to cross the data line DL and the power line VDD.

In each pixel region, the switching TFT Ts (of FIG. 2), the driving TFT Td (of FIG. 2), the reference TFT Tr (of FIG. 2), the storage capacitor Cst (of FIG. 2) and the emitting diode E (of FIG. 2) are formed.

The driving TFT Td includes a first oxide semiconductor layer 110, a first gate electrode 142, a first source electrode 162 and a first drain electrode 164, and the switching TFT Ts includes a second oxide semiconductor layer 120, a second gate electrode 144, a second source electrode 166 and a second drain electrode 168.

Figure 5:
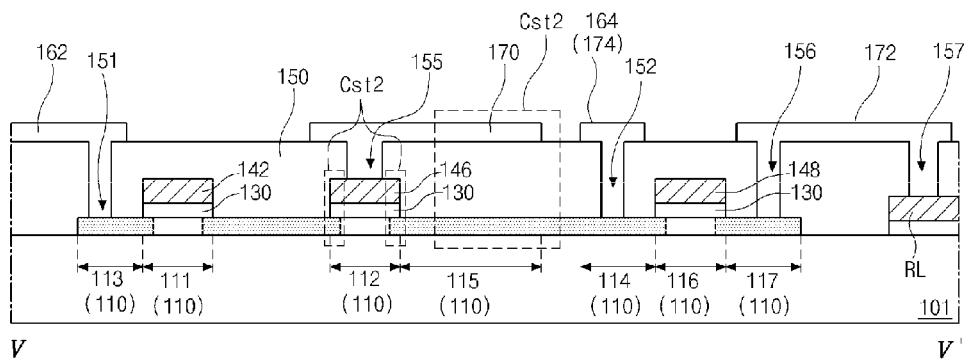
FIG. 5 is a cross-sectional view taken along the line V-V' in FIG. 3.

Referring to FIG. 5, which is a cross-sectional view taken along the line V-V' in FIG. 3, a first region 111 of the first oxide semiconductor layer 110 overlaps the first gate electrode 142 to serve as a channel of the driving TFT Td, and the first source electrode 162 and the first drain electrode 164 respectively contact third and fourth regions 113 and 114 of the first oxide semiconductor layer 110 at both sides of the first region 111. In this instance, an oxide semiconductor material in the third and fourth regions 113 and 114 of the first oxide semiconductor layer 110 is deoxidized such that the third and fourth regions 113 and 114 have a conductive property.

Namely, a first gate insulating layer 130 and the first gate electrode 142 are stacked on the first region 111 of the first oxide semiconductor layer 110, and a second insulating layer 150, which includes first and second semiconductor contact holes 151 and 152 respectively exposing the third and fourth regions 113 and 114 of the first oxide semiconductor layer 110, is formed to cover the first gate electrode 142. The first source electrode 162 and the first drain electrode 164 are formed on the second insulating layer 150 and respectively contact the third and fourth regions 113 and 114 of the first oxide semiconductor layer 110 through the first and second semiconductor contact holes 151 and 152. In this instance, each of the third and fourth regions 113 and 114 of the first oxide semiconductor layer 110 is deoxidized by a plasma process in a step of forming the first insulating layer 130 and the first gate electrode 142 to be conductive. The first insulating layer 130 may be a gate insulating layer, and the second insulating layer 150 may be an interlayer insulating layer.

Figure 6:
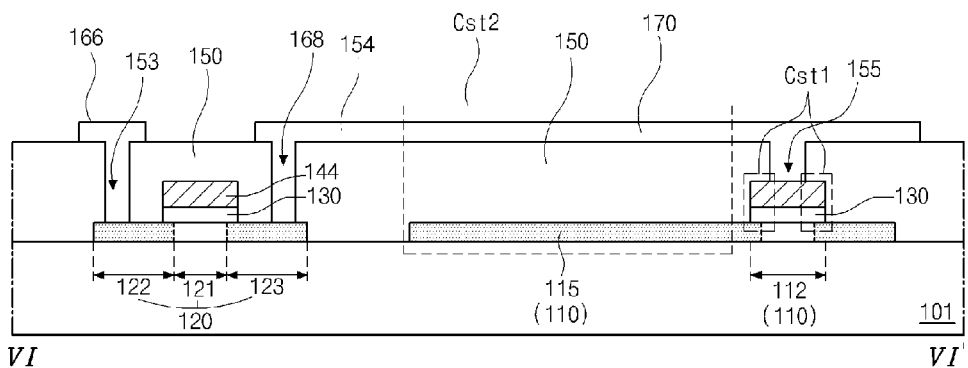
FIG. 6 is a cross-sectional view taken along the line VI-VI' in FIG. 3.

Referring to FIG. 6, which is a cross-sectional view taken along the line VI-VI' in FIG. 3, a first region 121 of the second oxide semiconductor layer 120 overlaps the second gate electrode 144 to serve as a channel of the switching TFT Ts, and the second source electrode 166 and the second drain electrode 168 respectively contact second and third regions 122 and 123 of the second oxide semiconductor layer 120 at both sides of the first region 121. In this instance, an oxide semiconductor material in the second and third regions 122 and 123 of the second oxide semiconductor layer 120 is deoxidized such that the second and third regions 122 and 123 have a conductive property.

Namely, the first gate insulating layer 130 and the second gate electrode 144 are stacked on the first region 121 of the second oxide semiconductor layer 120, and the second insulating layer 150, which further includes third and fourth semiconductor contact holes 153 and 154 respectively exposing the second and third regions 122 and 123 of the second oxide semiconductor layer 120, is formed to cover the second gate electrode 144. The second source electrode 166 and the second drain electrode 168 are formed on the second insulating layer 150 and respectively contact the second and third regions 122 and 123 of the second oxide semiconductor layer 120 through the third and fourth semiconductor contact holes 153 and 154. In this instance, each of the second and third regions 122 and 123 of the second oxide semiconductor layer 120 is deoxidized by a plasma process in a step of forming the first insulating layer 130 and the second gate electrode 144 to be conductive.

Referring again to FIG. 3, the reference TFT Tr includes a third oxide semiconductor layer, a third gate electrode 148, a third source electrode 172 and a third drain electrode 174. In FIG. 3, the third drain electrode 174 of the reference TFT Tr and the first drain electrode 164 of the driving TFT Td are the same element. Alternatively, the third drain electrode 174 of the reference TFT Tr and the first drain electrode 164 of the driving TFT Td may be formed to be separated from each other and to be electrically connected to each other by a connection pattern. In addition, in FIG. 3, the third oxide semiconductor layer is a portion of the first oxide semiconductor layer 110. Alternatively, the third semiconductor layer may be formed to be separated from the first oxide semiconductor layer 110.

Referring again to FIG. 5, a sixth region 116 of the first oxide semiconductor layer 110 overlaps the third gate electrode 148 to serve as a channel of the reference TFT Tr, and the third source electrode 172 and the third drain electrode 174 respectively contact the fourth region 114 and a seventh region 117 of the first oxide semiconductor layer 110 at both sides of the sixth region 116. One end of the third source electrode 172 contacts the first oxide semiconductor layer 110 through a fifth semiconductor contact hole 156, and the other end of the third source electrode 172 contacts the reference line RL through a reference contact hole 157. In this instance, an oxide semiconductor material in the fourth and seventh regions 114 and 117 of the first oxide semiconductor layer 110 is deoxidized such that the fourth and seventh regions 114 and 117 have a conductive property.

Referring again to FIG. 3, the switching TFT Ts is electrically connected to the gate line GL and the data line DL and is positioned at a crossing portion of the gate line GL and the data line DL. Namely, the second gate electrode 144 of the switching TFT Ts is connected to the gate line GL, and the second source electrode 166 of the switching TFT Ts is connected to the data line DL.

The first gate electrode 142 of the driving TFT Td is electrically connected to the second drain electrode 168 of the switching TFT Ts. Namely, an extending portion 170, which extends from the second drain electrode 168 of the switching TFT Ts, and the first gate electrode 142 of the driving TFT Td contact through a gate contact hole 155 such that the first gate electrode 142 of the driving TFT Td is electrically connected to the second drain electrode 168 of the switching TFT Ts. In more detail, the extending portion 170 of the second drain electrode 168 of the switching TFT Ts contacts an extending portion 146 of the first gate electrode 142 of the driving TFT Td. In addition, the first source electrode 162 of the driving TFT Td is connected to the power line VDD, and the first drain electrode 164 of the driving TFT Td is connected to the third drain electrode 174 of the reference TFT Tr.

In FIG. 3, the driving TFT Td and the reference TFT Tr share the drain electrode. Alternatively, the first drain electrode 164 of the driving TFT Td and the third drain electrode 174 of the reference TFT Tr may be formed to be separated and may be electrically connected.

The third gate electrode 148 of the reference TFT Tr is connected to the gate line GL, and the third source electrode 172 of the reference TFT Tr is connected to the reference line RL.

The first to third gate electrodes 142, 144 and 148, the extending portion 146 of the first gate electrode 146, the first to third source electrodes 162, 166 and 172, the first to third drain electrodes 164, 168 and 172 and the extending portion 170 of the second drain electrode 168 includes a low resistance metallic material, e.g., aluminum (Al), copper (Cu), molybdenum (Mo), titanium (Ti), chromium (Cr) and their alloys.

The emitting diode E is connected to the first drain electrode 164 of the driving TFT Td and includes an anode, an organic emitting layer and a cathode. For example, the anode is connected to the first drain electrode 164 of the driving TFT Td. In the OLED display device, the light from the organic emitting layer passes through the anode and the substrate 101 or passes through the cathode. Namely, the OLED display device is a bottom-emission type or a top emission-type.

The anode includes a relatively high work-function conductive material, and the cathode includes a relatively low work-function conductive material. For example, the anode may include a transparent conductive material such as indium-tin-oxide (ITO) or indium-zinc-oxide (IZO). The cathode may include Al, magnesium (Mg), silver (Ag), gold (Au) and their alloys.

In the top-emission type OLED display device, the cathode has a relatively small thickness to have the light transmittance of about 45 to 50%. In addition, in the top-emission type OLED display device, the anode may further include a reflection layer of an opaque reflective conductive material. For example, the reflection layer includes aluminum-palladium-copper (APC) alloy, and the anode may include a triple-layered structure of ITO/APC/ITO.

The organic emitting layer has a single-layered structure. On the other hand, to enhance the emission efficiency, the organic emitting layer may include a multi-layered structure of a hole injecting layer, a hole transporting layer, an emitting material layer, an electron transporting layer and an electron injecting layer stacked on the anode. The organic emitting layer includes red, green and blue emitting pattern in the pixel region.

In the emitting diode E, the hole from the anode and the electron from the cathode are combined in the organic emitting layer to generate an exciton. The exciton is transferred from an excitation state to a ground state such that the organic emitting layer emits the light.

The emitting diode E may be formed over the substrate 101 (of FIG. 5), on which the driving TFT Td is formed, or may be formed on a counter substrate (not shown) facing the substrate 101.

The storage capacitor Cst includes the first storage capacitor Cst1. A portion of the first oxide semiconductor layer 110 and the extending portion of the first gate electrode 142 overlap to form the first storage capacitor Cst1.

Referring to FIGS. 4A and 4B, the first storage capacitor Cst1 includes a first storage electrode 149 as an edge portion of the extending portion 146 of the first gate electrode 142 and a second storage electrode 118 as an edge portion of the second region 112 of the first semiconductor layer 110. The first oxide semiconductor layer 110 is deoxidized by the plasma process in or after a step of forming the extending portion 146 the first gate electrode 142. In this instance, since the extending portion 146 the first gate electrode 142 serves as a blocking mask, the edge portion of the second region 112 of the first oxide semiconductor layer 110 except a center portion of the second region 112 is deoxidized to be conductive. Namely, since the center portion of the second region 112 is blocked by the extending portion 146 of the first gate electrode 142 and the first insulating layer 130, the center portion of the second region 112 is not deoxidized and maintains the non-conductive property.

The second storage electrode 118 has a width of about 1.5 micrometers from an end of the edge of the extending portion 146 of the first gate electrode 142.

Accordingly, the first storage electrode 149 as the edge portion of the extending portion 146 of the first gate electrode 142, the second storage electrode 118 as the edge portion of the second region 112 of the first oxide semiconductor layer 110, which overlaps the first storage electrode 149, and the first insulating layer 130 therebetween constitute the first storage capacitor Cst1.

In addition, the storage capacitor Cst further includes a second storage capacitor Cst2. Referring to FIGS. 5 and 6, the second storage capacitor Cst2 includes a third storage electrode as a fifth region 115, which is conductive, of the first oxide semiconductor layer 110, a fourth storage electrode as the extending portion 170 of the second drain electrode 168 and the second insulating layer 150 as a dielectric layer between the third and fourth storage electrodes.

In the OLED display device of the present invention, since the first and second storage capacitors Cst1 and Cst2 use the second region 112 and the fifth region 115 of the first oxide semiconductor layer 110 as the second and third storage electrodes, respectively, the storage capacitance is increased or maximized without decreasing the aperture ratio.

In this instance, since the first storage capacitor Cst1 is formed along the edge portion of the extending portion 146 of the first gate electrode 142, an area of the first and second storage electrodes 149 and 118 is relatively small. However, since the first insulating layer 130 as the dielectric layer of the first storage capacitor Cst1 has a relatively small thickness, the first storage capacitor Cst1 has sufficient storage capacitance.

The second storage capacitor Cst2 includes the second insulating layer 150 as the dielectric layer between the third and fourth storage electrodes, while the first storage capacitor Cst1 includes the first insulating layer 130 as the dielectric layer between the first and second storage electrodes 149 and 118. The first insulating layer 130 is formed of an inorganic insulating material and has a first thickness. The second insulating layer 150 is formed of an organic insulating material and has a second thickness being greater than the first thickness. Accordingly, though the area of the first and second storage electrodes 149 and 118 of the first storage capacitor Cst1 is smaller than the area of the third and fourth storage electrodes of the second storage capacitor Cst2, the first and second storage capacitors Cst1 and Cst2 have similar or substantially same storage capacitance.

In more detail, the first insulating layer 130 is formed of the inorganic insulating material, e.g., silicon oxide or silicon nitride, and has the first thickness of about 100 to 200 angstroms. On the other hand, the second insulating layer 150 is formed of the organic insulating material, e.g., photo-acryl, and has the second thickness of about 300 to 600 angstroms. To minimize the parasitic capacitance between each of the source and drain electrodes and the gate electrode and minimize a step difference by lower elements, the second insulating layer 150 is formed of the organic insulating material to be thicker.

The first and second insulating layers 130 and 150 respectively serve as the dielectric layer of the first and second storage capacitors Cst1 and Cst2, and the storage capacitance "C" is provided by following equation:

$$C = \in * A/d$$

($\in$: a dielectric constant, A: an area of a storage electrode, and d: a distance between the storage electrodes)

The storage capacitance "C" is proportional to the storage electrode area "A" and the dielectric constant "$\in$" of the dielectric layer and is inversely-proportional to the distance "d" between the storage electrodes. With larger electrode area "A", high dielectric constant "$\in$" and smaller distance "d" between the storage electrodes, the storage capacitance "C" is increased.

The distance between the first and second storage electrodes 149 and 118 in the first storage capacitor Cst1 including the first insulating layer 130 of the first thickness of 100 to 200 Å is about one-third (⅓) of the distance between the third and fourth storage electrodes in the second storage capacitor Cst2 including the second insulating layer 150 of the second thickness of 300 to 600 Å. Accordingly, when the area of the first storage capacitor Cst1 is equal to the area of the second storage capacitor Cst2, the storage capacitance of the first storage capacitor Cst1 is three times of the storage capacitance of the second storage capacitor Cst2.

Accordingly, though the area of the first storage capacitor Cst1 is smaller than the area of the second storage capacitor Cst2, the first storage capacitor Cst1 has sufficient storage capacitance. As a result, with minimizing the decrease of the aperture ratio, the storage capacitance is maximized.

Referring again to FIG. 4A, the first storage capacitor Cst1 is formed at a portion of the first oxide semiconductor layer 110. In this instance, an electric current path of the driving TFT Td should not be blocked by the storage capacitor Cst1. Namely, the extending portion 146 of the first gate electrode 142 including the first storage electrode 149 does not run across the first oxide semiconductor layer 110. In other words, two sides of the extending portion 146 of the first gate electrode 142 at the electric current path of the driving TFT Td is positioned inside the first oxide semiconductor layer 110.

Figure 7:
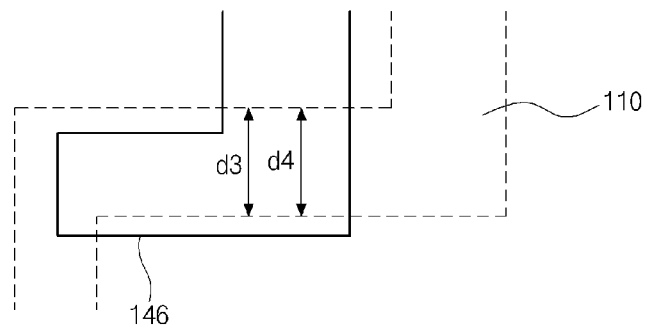
FIG. 7 is a plane view for explaining a problem in a storage capacitor.

For example, as shown in FIG. 7, which is a plane view for explaining a problem in a storage capacitor, when a side of the extending portion 146 of the first gate electrode 142 at the electric current path of the driving TFT Td runs across to be protrude beyond the first oxide semiconductor layer 110, the electric current from the first source electrode 162 to the first drain electrode 164 is blocked. In this instance, the extending portion 146 of the first electrode 142 also serves as a gate electrode of the driving TFT Td such that the second region 112 of the first oxide semiconductor layer 110 serves as a channel of the driving TFT Td. As a result, a desired channel is not provided, and the properties of the driving TFT Td are changed.

To prevent the above problem, the extending portion 146 of the first gate electrode 142 including the first storage electrode 149 does not run across the first oxide semiconductor layer 110.

In other words, the second region 112 of the first oxide semiconductor layer 110 has a first length "d1" with respect to a first direction, which crosses a second direction connecting the first source electrode 162 and the first drain electrode 164 along the first oxide semiconductor layer 110, and the overlapping region between the extending portion 146 of the first gate electrode 142 and the second region 112, i.e., the overlapping region between the first storage electrode 149 and the second region 112, has a second length "d2" with respect to the first direction. The second length "d2" is smaller than the first length "d1".

As shown in FIG. 7, when a third length "d3" of the second region 112 is equal to a fourth length "d4" of the overlapping region between the first storage electrode 149 and the second region 112, the electric current path between the first source electrode 162 and the first drain electrode 164 is blocked such that the properties of the driving TFT Td are degraded.

Figure 8A:
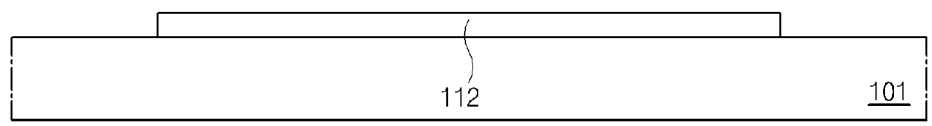
FIGS. 8A and 8D are cross-sectional views showing a fabricating process for a first storage capacitor.
Figure 8B:
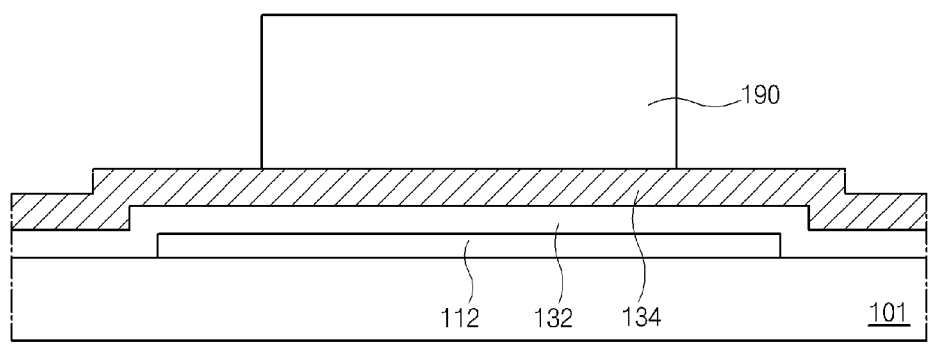
Figure 8C:
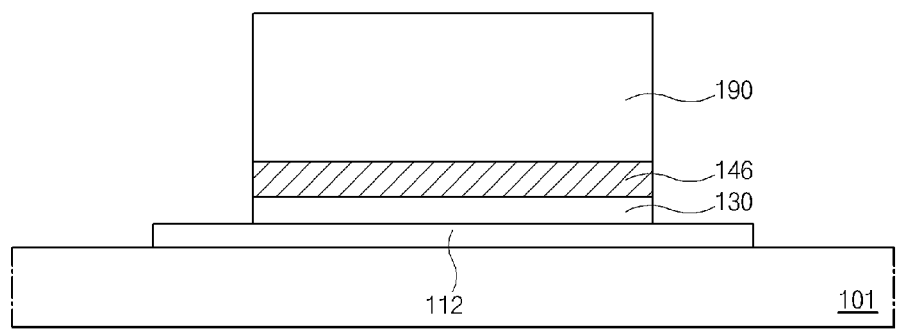
Figure 8D:
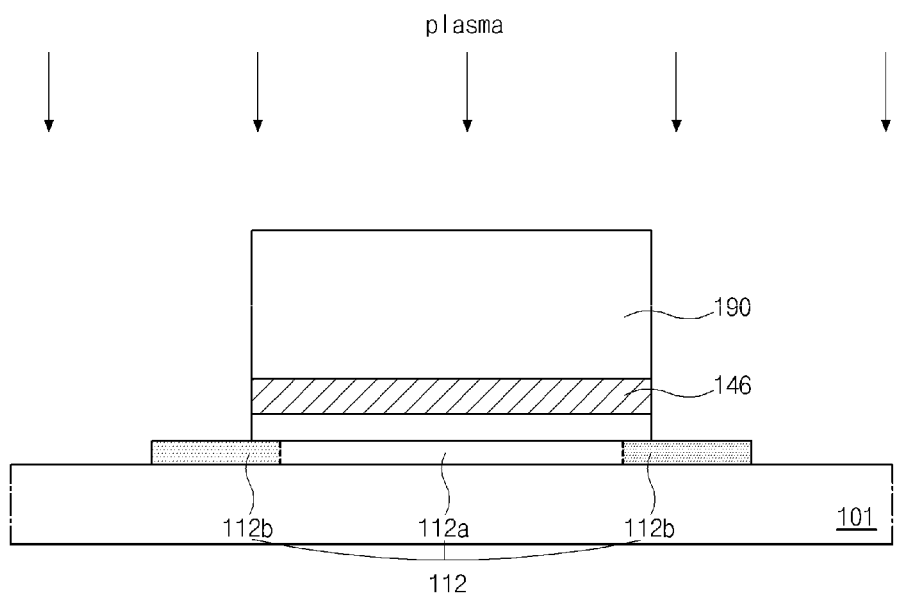

FIGS. 8A and 8D are cross-sectional views showing a fabricating process for a first storage capacitor.

As shown in FIG. 8A, an oxide semiconductor material is deposited on the substrate 101 and is patterned by a mask process to form the first oxide semiconductor layer 110 (of FIG. 5) including the second region 112. For example, the oxide semiconductor material may include one of indium-gallium-zinc-oxide (IGZO), indium-tin-zinc-oxide (ITZO), indium-zinc-oxide (IZO), indium-gallium-oxide (IGO) and indium-aluminum-zinc-oxide (IAZO).

Next, as shown in FIG. 8B, an inorganic insulating material layer 132 and a metal layer 134 are sequentially deposited on the second region 112 of the first oxide semiconductor layer 110, and a photoresist (PR) pattern 190 is formed on the metal layer 134 to correspond to the extending portion 146 (of FIG. 5) of the first gate electrode 142 (of FIG. 5). The inorganic insulating material layer 132 may include silicon oxide or silicon nitride.

Next, as shown in FIG. 8C, the inorganic insulating material layer 132 (of FIG. 8B) and the metal layer 134 (of FIG. 8B) are etched using the PR pattern 190 as an etching mask to form the extending portion 146 of the first gate electrode 142 and the first insulating layer 130.

Next, as shown in FIG. 8D, a plasma process is performed to the second region 112 of the first oxide semiconductor layer 110 using at least one of the PR pattern 190, the extending portion 146 and the first insulating layer 130 as a blocking mask to deoxidize the second region 112 of the first oxide semiconductor layer 110. For example, the plasma process uses sulfur hexafluoride (SF6) gas or carbon tetrafluoride (CF4) gas to deoxidize the second region 112 of the first oxide semiconductor layer 110. In this instance, after the PR pattern 190 is removed, the plasma process may be performed.

Since a portion of the first oxide semiconductor layer 110 should be deoxidized by the plasma process, the first insulating layer 130 has the same shape as the extending portion 146 of the first gate electrode 142. Namely, the first insulating layer 130 has substantially the same island shape as the extending portion 146 of the first gate electrode 142.

By deoxidizing the first oxide semiconductor layer 110 by the plasma process, the first oxide semiconductor layer 110 outside the extending portion 146 of the first gate electrode 142. In addition, an inside portion of the first oxide semiconductor layer 110 under the extending portion 146 of the first gate electrode 142 is deoxidized by the gas of the plasma process. Namely, by the plasma process, the second region 112 of the first oxide semiconductor layer 110 is divided into a center region 112a, which is not deoxidized, and an edge region 112b, which is deoxidized to be conductive, and the edge region 112b serves as the second storage electrode 118 (of FIG. 4B).

Accordingly, the first storage capacitor Cst1 including the first insulating layer 130 as the dielectric layer is provided, and the storage capacitor Cst of the OLED display device has the sufficient storage capacitance and the decrease of the aperture ratio is prevented or minimized.

Figure 9:
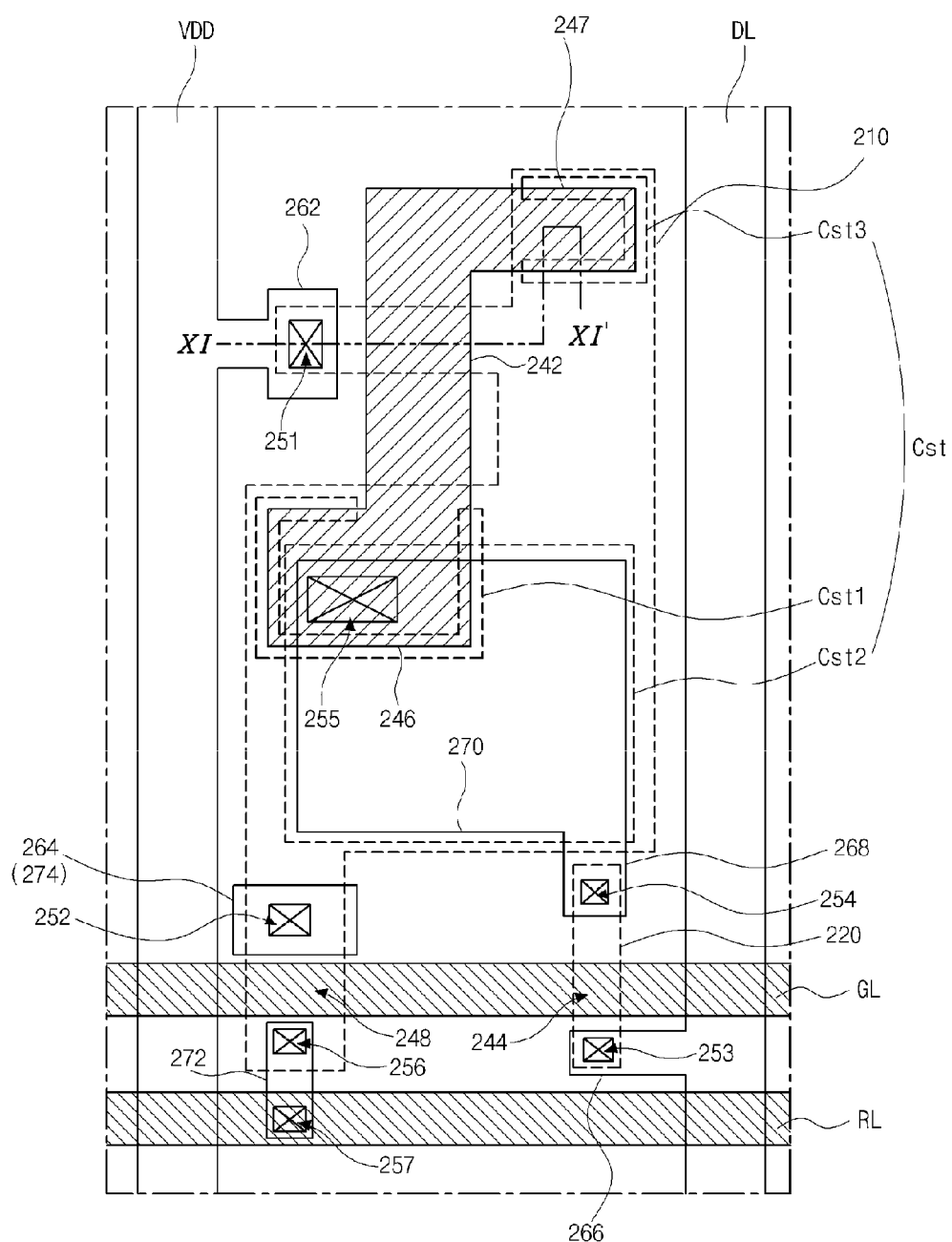
FIG. 9 is a plane view of a portion of an OLED display device according to a second embodiment of the present invention.
Figure 10:
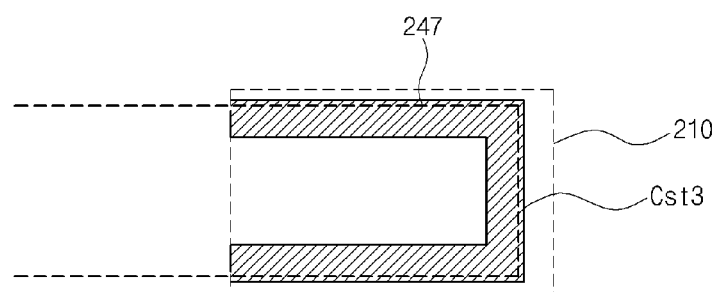
FIG. 10 is a plane view of a third storage capacitor in FIG. 9.

FIG. 9 is a plane view of a portion of an OLED display device according to a second embodiment of the present invention. FIG. 10 is a plane view of a third storage capacitor in FIG. 9, and FIG. 11 is a cross-sectional view taken along the line XI-XI' in FIG. 9.

Figure 11:
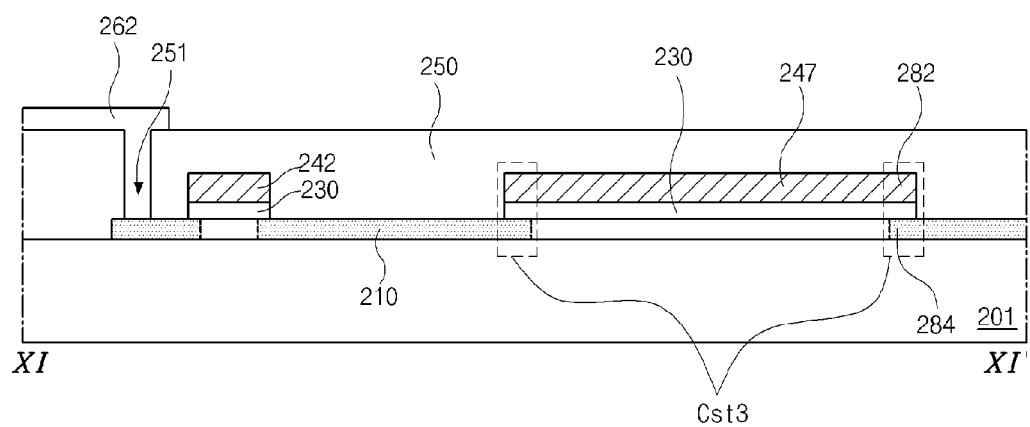
FIG. 11 is a cross-sectional view taken along the line XI-XI' in FIG. 9.

As shown in FIGS. 9 to 11, in the OLED display device according to the second embodiment of the present invention, the gate line GL and the data line DL cross each other to define the pixel region. In addition, the power line VDD is spaced apart from and is parallel to the data line DL to cross the gate line GL, and the reference line RL is spaced apart from and is parallel to the gate line GL to cross the data line DL and the power line VDD.

In each pixel region, the switching TFT Ts (of FIG. 2), the driving TFT Td (of FIG. 2), the reference TFT Tr (of FIG. 2), the storage capacitor Cst (of FIG. 2) and the emitting diode E (of FIG. 2) are formed.

The driving TFT Td includes a first oxide semiconductor layer 210, a first gate electrode 242, a first source electrode 262 and a first drain electrode 264, and the switching TFT Ts includes a second oxide semiconductor layer 220, a second gate electrode 244, a second source electrode 266 and a second drain electrode 268.

A first region (not shown) of the first oxide semiconductor layer 210 overlaps the first gate electrode 242 to serve as a channel of the driving TFT Td, and the first source electrode 262 and the first drain electrode 264 respectively contact third and fourth regions (not shown) of the first oxide semiconductor layer 210 at both sides of the first region (not shown). In this instance, an oxide semiconductor material in the third and fourth regions (not shown) of the first oxide semiconductor layer 210 is deoxidized such that the third and fourth regions (not shown) have a conductive property.

Namely, a first gate insulating layer 230 and the first gate electrode 242 are stacked on the first region (not shown) of the first oxide semiconductor layer 210, and a second insulating layer 250, which includes first and second semiconductor contact holes 251 and 252 respectively exposing the third and fourth regions (not shown) of the first oxide semiconductor layer 210, is formed to cover the first gate electrode 242. The first source electrode 262 and the first drain electrode 264 are formed on the second insulating layer 250 and respectively contact the third and fourth regions (not shown) of the first oxide semiconductor layer 210 through the first and second semiconductor contact holes 251 and 252. In this instance, each of the third and fourth regions (not shown) of the first oxide semiconductor layer 210 is deoxidized by a plasma process in a step of forming the first insulating layer 230 and the first gate electrode 242 to be conductive. The first insulating layer 230 may be a gate insulating layer, and the second insulating layer 250 may be an interlayer insulating layer.

A first region (not shown) of the second oxide semiconductor layer 220 overlaps the second gate electrode 244 to serve as a channel of the switching TFT Ts, and the second source electrode 266 and the second drain electrode 268 respectively contact second and third regions (not shown) of the second oxide semiconductor layer 220 at both sides of the first region (not shown). In this instance, an oxide semiconductor material in the second and third regions (not shown) of the second oxide semiconductor layer 220 is deoxidized such that the second and third regions (not shown) have a conductive property.

Namely, the first gate insulating layer 230 and the second gate electrode 244 are stacked on the first region (not shown) of the second oxide semiconductor layer 220, and the second insulating layer 250, which further includes third and fourth semiconductor contact holes 153 and 154 respectively exposing the second and third regions (not shown) of the second oxide semiconductor layer 220, is formed to cover the second gate electrode 244. The second source electrode 266 and the second drain electrode 268 are formed on the second insulating layer 250 and respectively contact the second and third regions (not shown) of the second oxide semiconductor layer 220 through the third and fourth semiconductor contact holes 253 and 254. In this instance, each of the second and third regions (not shown) of the second oxide semiconductor layer 220 is deoxidized by a plasma process in a step of forming the first insulating layer 230 and the second gate electrode 244 to be conductive.

The reference TFT Tr includes a third oxide semiconductor layer, a third gate electrode 248, a third source electrode 272 and a third drain electrode 274. In FIG. 9, the third drain electrode 274 of the reference TFT Tr and the first drain electrode 264 of the driving TFT Td are the same element. Alternatively, the third drain electrode 274 of the reference TFT Tr and the first drain electrode 264 of the driving TFT Td may be formed to be separated from each other and to be electrically connected to each other by a connection pattern. In addition, in FIG. 9, the third oxide semiconductor layer is a portion of the first oxide semiconductor layer 210. Alternatively, the third semiconductor layer may be formed to be separated from the first oxide semiconductor layer 210.

A sixth region (not shown) of the first oxide semiconductor layer 210 overlaps the third gate electrode 248 to serve as a channel of the reference TFT Tr, and the third source electrode 272 and the third drain electrode 274 respectively contact the fourth region (not shown) and a seventh region (not shown) of the first oxide semiconductor layer 210 at both sides of the sixth region (not shown). One end of the third source electrode 272 contacts the first oxide semiconductor layer 210 through a fifth semiconductor contact hole 256, and the other end of the third source electrode 272 contacts the reference line RL through a reference contact hole 257. In this instance, an oxide semiconductor material in the fourth and seventh regions (not shown) of the first oxide semiconductor layer 210 is deoxidized such that the fourth and seventh regions (not shown) have a conductive property.

The switching TFT Ts is electrically connected to the gate line GL and the data line DL and is positioned at a crossing portion of the gate line GL and the data line DL. Namely, the second gate electrode 244 of the switching TFT Ts is connected to the gate line GL, and the second source electrode 266 of the switching TFT Ts is connected to the data line DL.

The first gate electrode 242 of the driving TFT Td is electrically connected to the second drain electrode 268 of the switching TFT Ts. Namely, an extending portion 270, which extends from the second drain electrode 268 of the switching TFT Ts, and the first gate electrode 242 of the driving TFT Td contact through a gate contact hole 255 such that the first gate electrode 242 of the driving TFT Td is electrically connected to the second drain electrode 268 of the switching TFT Ts. In more detail, the extending portion 270 of the second drain electrode 268 of the switching TFT Ts contacts a first extending portion 246 of the first gate electrode 242 of the driving TFT Td. In addition, the first source electrode 262 of the driving TFT Td is connected to the power line VDD, and the first drain electrode 264 of the driving TFT Td is connected to the third drain electrode 274 of the reference TFT Tr.

In FIG. 9, the driving TFT Td and the reference TFT Tr share the drain electrode. Alternatively, the first drain electrode 264 of the driving TFT Td and the third drain electrode 274 of the reference TFT Tr may be formed to be separated and may be electrically connected.

The third gate electrode 248 of the reference TFT Tr is connected to the gate line GL, and the third source electrode 272 of the reference TFT Tr is connected to the reference line RL.

The emitting diode E is connected to the first drain electrode 264 of the driving TFT Td and includes an anode, an organic emitting layer and a cathode. For example, the anode is connected to the first drain electrode 264 of the driving TFT Td. In the OLED display device, the light from the organic emitting layer passes through the anode and the substrate 201 or passes through the cathode. Namely, the OLED display device is a bottom-emission type or a top emission-type.

The emitting diode E may be formed over the substrate 201, on which the driving TFT Td is formed, or may be formed on a counter substrate (not shown) facing the substrate 201.

The storage capacitor Cst includes the first storage capacitor Cst1. A portion of the first oxide semiconductor layer 210 and a first extending portion 246 of the first gate electrode 242 overlap to form the first storage capacitor Cst1.

The first storage capacitor Cst1 includes a first storage electrode (not shown) as an edge portion of the first extending portion 246 of the first gate electrode 242 and a second storage electrode (not shown) as an edge portion of the second region (not shown) of the first semiconductor layer 210. The first oxide semiconductor layer 210 is deoxidized by the plasma process in or after a step of forming the first extending portion 246 the first gate electrode 242. In this instance, since the first extending portion 246 the first gate electrode 242 serves as a blocking mask, the edge portion of the second region 112 of the first oxide semiconductor layer except a center portion of the second region (not shown) is deoxidized to be conductive. Namely, since the center portion of the second region (not shown) is blocked by the first extending portion 246 of the first gate electrode 242 and the first insulating layer 230, the center portion of the second region (not shown) is not deoxidized and maintains the non-conductive property.

The second storage electrode (not shown) has a width of about 1.5 micrometers from an end of the edge of the first extending portion 246 of the first gate electrode 242.

Accordingly, the first storage electrode (not shown) as the edge portion of the first extending portion 246 of the first gate electrode 242, the second storage electrode (not shown) as the edge portion of the second region (not shown) of the first oxide semiconductor layer 210, which overlaps the first storage electrode (not shown), and the first insulating layer 230 therebetween constitute the first storage capacitor Cst1.

In addition, the storage capacitor Cst further includes a second storage capacitor Cst2. The second storage capacitor Cst2 includes a third storage electrode as a fifth region (not shown), which is conductive, of the first oxide semiconductor layer 210, a fourth storage electrode as the extending portion 270 of the second drain electrode 268 and the second insulating layer 250 as a dielectric layer between the third and fourth storage electrodes.

Moreover, the storage capacitor Cst further includes a third storage capacitor Cst3. The third storage capacitor Cst3 includes a portion of the first semiconductor layer 210 and a second extending portion 247 of the first gate electrode 242.

Namely, the third storage capacitor Cst3 includes a fifth storage electrode 282 as an edge portion of the second extending portion 247 of the first gate electrode 242 and a sixth storage electrode 284 as an edge portion of the first oxide semiconductor layer 210 overlapping the second extending portion 247 of the first gate electrode 242, i.e., the fifth storage electrode 282. The first oxide semiconductor layer 210 is deoxidized by the plasma process in or after a step of forming the second extending portion 247 the first gate electrode 242. In this instance, since the second extending portion 247 the first gate electrode 242 serves as a blocking mask, the edge portion of the first oxide semiconductor layer 210 except a center portion of the first oxide semiconductor layer 210 is deoxidized to be conductive. Namely, since the center portion of the first oxide semiconductor layer 210 is blocked by the second extending portion 247 of the first gate electrode 242 and the first insulating layer 230, the center portion of the first oxide semiconductor layer 210 is not deoxidized and maintains the non-conductive property.

The sixth storage electrode 284 has a width of about 1.5 micrometers from an end of the edge of the second extending portion 247 of the first gate electrode 242.

Accordingly, the fifth storage electrode 282 as the edge portion of the second extending portion 247 of the first gate electrode 242, the sixth storage electrode 284 as the edge portion of the first oxide semiconductor layer 210, which overlaps the fifth storage electrode 282, and the first insulating layer 230 therebetween constitute the third storage capacitor Cst3.

In the OLED display device according to the second embodiment of the present invention, since the first to third storage capacitors Cst1, Cst2 and Cst3 use a portion of the first oxide semiconductor layer 210 as the second, third and sixth storage electrodes, respectively, the storage capacitance is increased or maximized without decreasing the aperture ratio.

In this instance, since each of the first and third storage capacitors Cst1 and Cst3 is formed along the edge portion of the first and second extending portions 246 and 247 of the first gate electrode 242, an area of the first and third storage capacitors Cst1 and Cst3 is relatively small. However, since the first insulating layer 130 as the dielectric layer of the first and third storage capacitors Cst1 and Cst3 has a relatively small thickness, the first and third storage capacitors Cst1 and Cst3 have sufficient storage capacitance.

Each of the first and third storage capacitors Cst1 and Cst3 includes the first insulating layer 230 as the dielectric layer. The first insulating layer 230 is formed of an inorganic insulating material and has a relatively small thickness. Accordingly, though the area of the first and third storage capacitors Cst1 and Cst3 is relatively small, the first and third storage capacitors Cst1 and Cst3 have sufficient storage capacitance.

As mentioned above, in the OLED display device of the present invention, the oxide semiconductor layer is deoxidized using the storage electrode as a blocking mask to be conductive, and the deoxidized portion of the oxide semiconductor layer uses as a storage electrode. Namely, additional storage electrode is not required. Accordingly, the storage capacitance is increase without decreasing the aperture ratio.

In addition, since the first and third storage capacitors includes the first insulating layer, which has a relatively small thickness, as a dielectric layer, the storage capacitors have sufficient storage capacitance with a relatively small electrode area. Accordingly, the decrease of the aperture ratio of the OLED display device is minimized or prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic emitting diode display device, comprising:
a first oxide semiconductor layer including first to fourth regions;
a first insulating layer on the first oxide semiconductor layer;
a first gate electrode on the first insulating layer and completely overlapping the first region;
a first storage electrode extending from the first gate electrode and overlapping the second region;
a second insulating layer covering the first gate electrode and the first storage electrode and exposing the third and fourth regions;
first source and drain electrodes on the second insulating layer and contacting the third and fourth regions; and
an emitting diode connected to the first drain electrode,
wherein a portion of the second region at an edge of the first storage electrode except a center of the first storage electrode is conductive to form a second storage electrode, and the first and second storage electrodes and the first insulating layer constitute a first storage capacitor.

2. The device according to claim 1, wherein the second region has a first length with respect to a first direction, which crosses a second direction connecting the first source electrode and the first drain electrode along the first oxide semiconductor layer, and the overlapping region between the first storage electrode and the second region has a second length with respect to the first direction, and wherein the second length is smaller than the first length.

3. The device according to claim 1, wherein the first insulating layer has a first thickness, and the second insulating layer has a second thickness being greater than the first thickness.

4. The device according to claim 1, further comprising:
a second oxide semiconductor layer under the first insulating layer;
a second gate electrode on the first insulating layer and overlapping the second oxide semiconductor layer;
second source and drain electrodes on the second insulating layer and respectively contacting first and second sides of the second oxide semiconductor layer; and
an extending portion extending from the second drain electrode to connect the second drain electrode with the first gate electrode,
wherein the extending portion overlaps a fifth region of the first oxide semiconductor layer, and the fifth region is conductive, and wherein the extending portion, the fifth region and the second insulating layer constitute a second storage capacitor.

5. The device according to claim 4, further comprising:
a gate line extending along a third direction;
a data line extending along a fourth direction to cross the gate line; and
a power line extending to be parallel to one of the gate and data lines,
wherein the second gate electrode is connected to the gate line, and the second source electrode is connected to the data line, and wherein the first source electrode is connected to the power line.

6. The device according to claim 5, wherein the first oxide semiconductor layer, the first gate electrode, the first source electrode and the first drain electrode constitute a driving thin film transistor, and the second oxide semiconductor layer, the second gate electrode, the second source electrode and the second drain electrode constitute a switching thin film transistor, and
the device further comprising:
a reference line extending to be parallel to the other one of the gate and data lines; and
a reference thin film transistor connected to the gate line, the first drain electrode and the reference line to control a threshold voltage of the driving thin film transistor.

7. The device according to claim 4, further comprising a third storage electrode extending from the first gate electrode and overlapping a sixth region of the first oxide semiconductor layer,
wherein a portion of the sixth region at an edge of the third storage electrode except a center of the third storage electrode is conductive to form a fourth storage electrode, and the third and fourth storage electrodes and the first insulating layer constitute a third storage capacitor.

8. A method of fabricating an organic light emitting diode display device, comprising:
forming an oxide semiconductor layer on a substrate;
forming a first insulating pattern and a gate electrode on a first region of the oxide semiconductor layer and a second insulating pattern and a first storage electrode on a second region of the oxide semiconductor layer;
deoxidizing a portion of the second region inside an edge of the first storage electrode by performing a plasma process;
forming an insulating layer exposing third and fourth regions of the oxide semiconductor layer at both sides of the first region and covering the gate electrode and the first storage electrode;
forming source and drain electrodes on the insulating layer and contacting the third and fourth regions; and
forming an emitting diode connected to the drain electrode.

9. The method according to claim 8, wherein a portion of the second region at an edge of the first storage electrode except a center of the first storage electrode is deoxidized in the step of deoxidizing the portion of the second region inside the edge of the first storage electrode by performing the plasma process such that the deoxidized portion form a second storage electrode, and
wherein the first and second storage electrodes and the first insulating layer constitute a first storage capacitor.

10. The device according to claim 8, wherein the step of forming the first insulating pattern and the gate electrode on the first region of the oxide semiconductor layer and the second insulating pattern and the first storage electrode on the second region of the oxide semiconductor layer includes:
sequentially forming an insulating film and a metal film on the oxide semiconductor layer;
forming first and second photoresist patterns on the metal layer and corresponding to the first and second regions; and
etching the metal film and the insulating film using the first and second photoresist patterns to form the first and second insulating patterns, the gate electrode and the first storage electrode,
wherein the plasma process uses at least one of the second photoresist pattern and the first storage electrode as a blocking mask and uses SF6 gas or CF4 gas.

* * * * *